(12) United States Patent
Lee

(10) Patent No.: US 6,275,439 B1
(45) Date of Patent: Aug. 14, 2001

(54) POWER SUPPLY CONTROL APPARATUS FOR CHANGING POWER LINE CONNECTION TYPE IN RESPONSE TO OPERATION MODE IN SEMICONDUCTOR MEMORY DEVICE

(75) Inventor: Jae-Jin Lee, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/604,516

(22) Filed: Jun. 27, 2000

(30) Foreign Application Priority Data

Jun. 28, 1999 (KR) .................................................. 99-24844

(51) Int. Cl.$^7$ ...................................................... G11C 7/00
(52) U.S. Cl. ........................ 365/226; 365/193; 365/222; 365/230.03
(58) Field of Search .................................... 365/226, 222, 365/193, 230.03, 189.01, 230.01

(56) References Cited

U.S. PATENT DOCUMENTS

| 5,590,082 | 12/1996 | Abe | 365/222 |
|---|---|---|---|
| 5,640,357 | 6/1997 | Kakimi | 365/229 |
| 5,740,118 | 4/1998 | Sato et al. | 365/222 |
| 5,995,434 | * 11/1999 | Ruy | 365/222 |

FOREIGN PATENT DOCUMENTS

| 63-2199 | 1/1988 | (JP) | G11C/19/28 |
|---|---|---|---|
| 2-12698 | 1/1990 | (JP) | . |
| 2-177082 | 7/1990 | (JP) | G11C/11/409 |
| 3-198295 | 8/1991 | (JP) | G11C/11/417 |
| 05036263 | 12/1993 | (JP) | G11C/5/00 |
| 06140578 | 5/1994 | (JP) | H01L/27/04 |
| 06068694 | 11/1994 | (JP) | G11C/29/00 |
| 07235182 | 5/1995 | (JP) | G11C/11/409 |
| 08203279 | 9/1996 | (JP) | G11C/11/413 |
| 11144465 | 5/1999 | (JP) | G11C/11/409 |

\* cited by examiner

*Primary Examiner*—Hoai V. Ho
(74) *Attorney, Agent, or Firm*—Jacobson Holman, PLLC

(57) ABSTRACT

The present invention relates to a power supply selectively using a chip driving power and a data input/output driving power in a semiconductor device. The power supply according to the present invention includes a switch for selectively coupling a first power line providing power to an internal circuit to a second power line providing power to a data input/output unit in response to a control signal which is produces according to an operation mode; and a controller for receiving row address strobe signals corresponding to each of memory banks, and a self-refresh signal activated in a refresh mode and producing the control signal. Accordingly, the present invention has an effect on the reduction of a noise generated on the power line, by selectively using the chip driving power and the data input/output driving power. Furthermore, the present invention increases the operation speed of the memory device by effectively using the power lines.

11 Claims, 2 Drawing Sheets

POWER SUPPLY CONTROL APPARATUS FOR CHANGING POWER LINE CONNECTION TYPE IN RESPONSE TO OPERATION MODE IN SEMICONDUCTOR MEMORY DEVICE

FIELD OF THE INVENTION

The present invention relates to a power supply in a semiconductor device; and, more particularly, to a power supply selectively using a chip driving power and a data input/output driving power in a semiconductor device.

DESCRIPTION OF THE PRIOR ARTS

Generally, in DRAM (dynamic random access memory) device, a power supply applied to the device has been used in driving both the memory chip and data input/output devices without using a separate power supply. However, in synchronous DRAM devices having fast data input/output speed, two power supplies, i.e., first and second power supplies Vcc and Vccq, are employed to supply power to an internal circuit and data input/output devices.

Referring to FIG. 1, a conventional power supply includes a first power supply Vcc for driving an internal circuit 110 and a second power supply Vccq for driving a data input/output unit 150.

However, nevertheless the separate power supply to drive the data input/output is prepared, it is not contributed to the high speed operation, especially in a refresh mode because only the first power supply is used. Accordingly, it is easy to make a noise and many refresh operations are needed.

SUMMARY OF THE INVENTION

It is, therefore, an object of the present invention to provide a power supply control apparatus to increase operation speed in a memory device, by alternatively changing a power line connection type based on an operation mode of a memory device.

It is another object of the present invention to provide a power supply control apparatus to minimize a noise and improve operation speed of a memory device.

In accordance with an aspect of the present invention, there is provided a semiconductor memory device comprising: a switching means for selectively coupling a first power line providing power to an internal circuit to a second power line providing power to a data input/output unit in response to a control signal which is produces according to an operation mode; and a control means for receiving row address strobe signals corresponding to each of memory banks, and a self-refresh signal activated in a refresh mode and producing the control signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
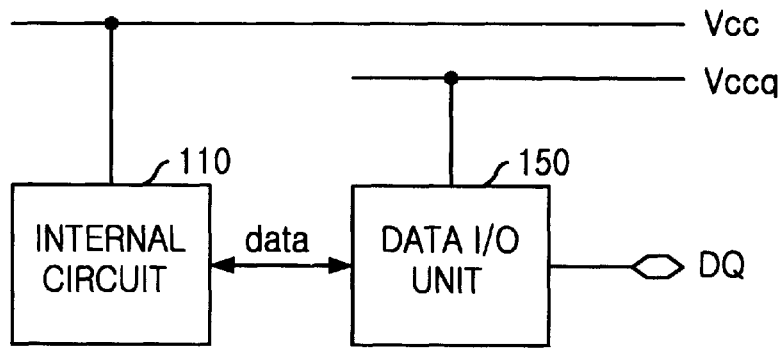
FIG. 1 is a block diagram illustrating a conventional power supply.
Figure 2:
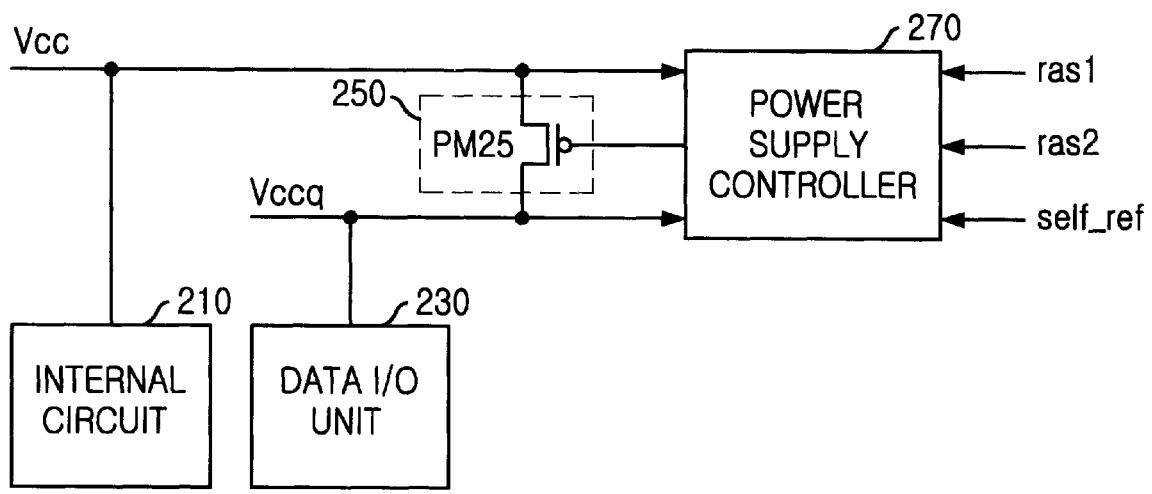
FIG. 2 is a block diagram illustrating a power supply according to the present invention.

Referring to FIG. 2, a power supply according to the present invention includes a power supply controller 270 to control a first power supply line Vcc applied to an internal circuit 210 and a second power supply line Vccq applied to a data input/output unit 230. A switch 250 couples the first power supply line Vcc to the second power supply line Vccg in response to a switch enable signal /sw_en from the power supply controller 270 which is produced based on an operation mode. The power supply controller 270 receives a first row address strobe signal (hereinafter, referred to as an "RAS signal") ras1 which is enabled in an active mode of a first bank in the memory device, a second RAS signal ras2 which is enabled in an active mode of a second bank in the memory device, and a cell refresh signal self_ref which is activated in a refresh mode of the memory device. Also, the first power supply line Vcc and the second power supply line Vccq are coupled to the power supply controller 270 which produces the switch enable signal /sw_en. The switch 250 electrically connects the first power supply line Vcc to the second power supply line Vccq in response to the switch enable signal /sw_en from the power supply controller 270.

Figure 3:
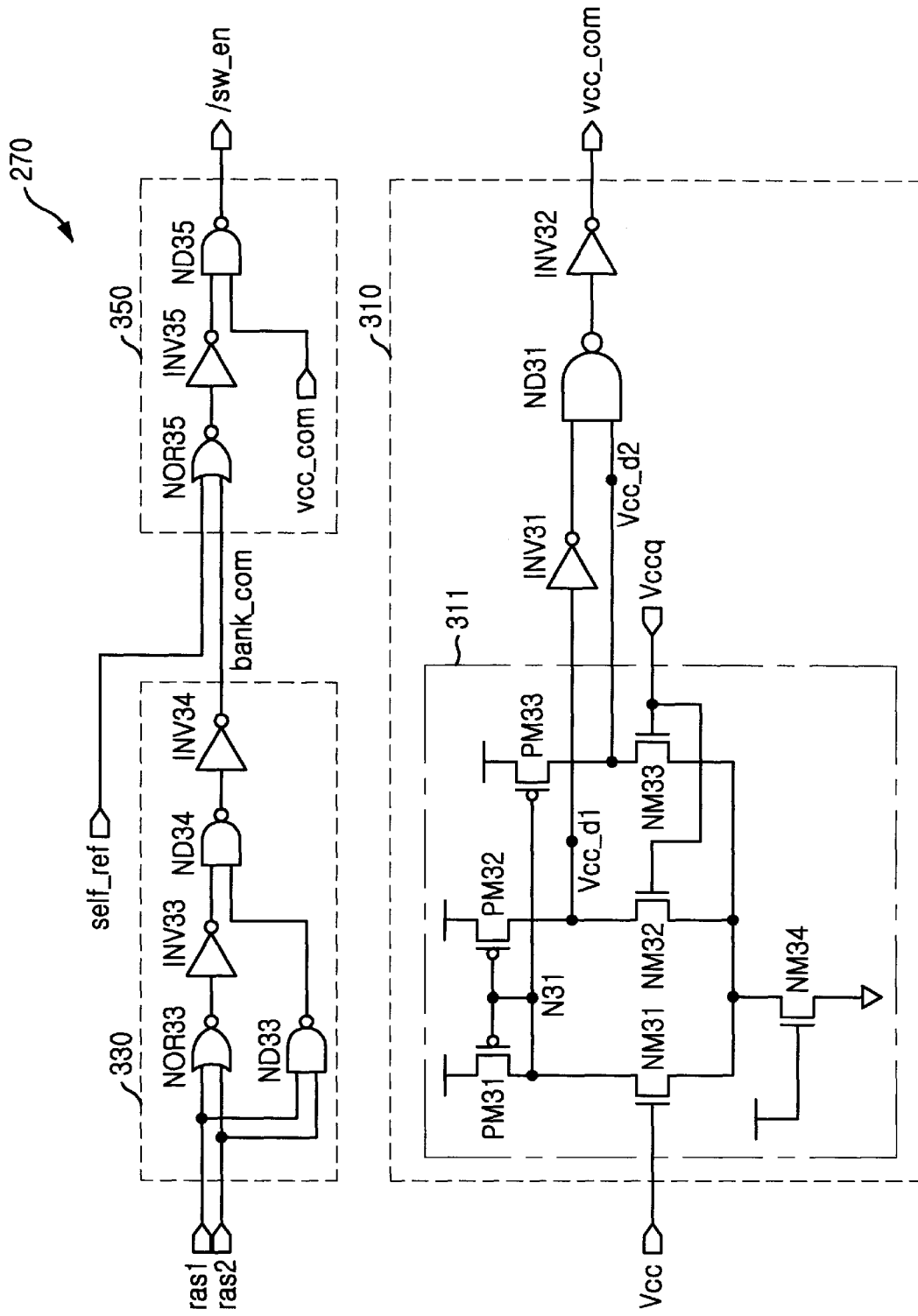
FIG. 3 is a configuration of a control unit in FIG. 2.

Referring to FIG. 3, the power supply controller 270 includes a bank comparison unit 330, a power supply comparison unit 310 and a switch enable signal generator 350. The bank comparison unit 330 compares the first RAS signal rasl with the second RAS signal ras2 and produces a bank comparison signal bank_com as a result signal of the comparison. The power supply comparison unit 310 coupled to the first power supply line Vcc and the second power supply line Vccq produces a power comparison signal Vcc_com when a voltage difference (ΔV) between the two power supply lines Vcc and Vccq is within a predetermined voltage range. The switch enable signal generator 350 receives the bank comparison signal bank_com, the cell refresh signal self_ref and the power comparison signal Vcc_com and produces the switch enable signal /sw_en.

The bank comparison unit 330 includes a NOR gate NOR33 receiving the first RAS signal rasl and the second RAS signal ras2, an inverter INV33 receiving an output signal from the NOR gate NOR33, a NAND gate ND33 receiving the first RAS signal ras1 and the second RAS signal ras2, a NAND gate ND34 receiving output signals from the inverter INV33 and the NAND gate NAND33, and an inverter INV34 inverting an output signal from the NAND gate ND34 to produce the bank comparison signal bank_com.

The power supply comparison unit 310 includes a differential amplifier 311, which receives two voltage signals from the first power supply line Vcc and the second power supply line Vccq and produces a first comparison signal Vcc_d1 and a second comparison signal Vcc_d2, an inverter INV31 inverting the first comparison signal Vcc_d1, a NAND gate ND31 for NANDing an output from the inverter INV31 and the second comparison signal Vcc_d2, and an inverter INV31 inverting an output from the NAND gate ND31.

The differential amplifier 311 includes a plurality of PMOS transistors NM31 to NM34 and a plurality of PMOS transistors PM31 to PM33. The NOMS transistor NM34 receives an enable signal (a power supply) in order to turn on the differential amplifier 311, and the NOMS transistor NM31 pulls down the voltage at node N31 in response to the first power supply line Vcc. The NOMS transistor NM32, which has a higher drivability than the NOMS transistor NM31, receives the second power supply line Vccq and pulls down the first comparison signal Vcc_d1 and the NOMS transistor NM33, which has a lower drivability than the NOMS transistor NM31, receives the second power supply line Vccq and pulls down the second comparison signal Vcc_d2. The PMOS transistor PM31 pulls up node N31 with a gate receiving the voltage at node N31, the PMOS transistor PM32 makes the first comparison signal Vcc_d1 in a high voltage level through a gate receiving the voltage at node N31, and the PMOS transistor PM33 makes the second comparison signal Vcc_d2 in a high voltage level through a gate receiving the voltage at node N31.

The switch enable signal generator 350 includes a NOR gate NOR35 for NORing the cell refresh signal self_ref and the bank comparison signal bank_com, an inverter INV35 for inverting an output from the NOR gate NOR35, and a NAND gate ND35 for NANDing an output from the inverter INV35 and the power comparison signal Vcc_com to produce the switch enable signal/sw_en.

The switch enable signal /sw_en controls the electrical connection between the first power supply line Vcc and the second power supply line Vccq. The switch enable signal /sw_en is activated when the memory device is in the refresh mode and when only one of at least two banks is in an active mode. That is, in case where one of the first and second RAS signals ras1 and ras2, each of which activates the different bank, is enabled in a high voltage level or the self-refresh signal self_ref, which is enabled in a high voltage level at the time of the self-refresh mode, is enabled in a high voltage level, the switch enable signal /sw_en is activated in a low voltage level. Accordingly, since the PMOS transistor PM25 is turned on by the low-activated switch enable signal /sw_en, the first and second power supply lines Vcc and Vccq are coupled to each other.

In the above refresh mode, since the second power supply (Vccq) applied to the data input/output unit 230 is not used, it is connected to the first power supply line Vcc carrying out the refresh in order to provide enough power to the internal circuit 210. This may reduce a noise with a stable operation, proving a sufficient cell potential to the internal circuit 210 with the increase of desired refresh interval time. In case where two banks are simultaneously working or there is no cell refresh mode, the PMOS transistor PM25 is turned off and then the first power supply line Vcc is separated from the second power supply line Vccq. In this case, since only the second power supply with a low-noise is provided to the data input/output unit 230, the data input/output unit 230 may carry out stable data processing operation.

Referring again to FIG. 3, when the power comparison signal Vcc_com is activated, the switch enable signal /sw_en is enabled in case where the self-refresh signal self_ref and the bank comparison signal bank_com are activated. The power comparison signal Vcc_com is activated in a high voltage level only when there is a predetermined voltage difference ($\Delta V$) between the first power supply line Vcc and the second power supply line Vccq. When a voltage difference occurs within a predetermined voltage range, this is to prevent the possibility of current flow between the first power supply line Vcc and the second power supply line Vccq, by disabling the switch enable signal /sw_en.

The voltage comparison between the first power supply line Vcc and the second power supply line Vccq is performed in the differential amplifier 311. That is, the voltage comparison is made by different-sized NMOS transistors. The NMOS transistor NM31 receiving the first power supply (Vcc) differs from the NMOS transistors NM32 and NM33 receiving the second power supply (Vccq) in their size. The drivability of the NMOS transistor NM32 is larger than that of the NMOS transistor NM31 and also the drivability of the NMOS transistor NM33 is larger than that of the NMOS transistor NM31.

Accordingly, in case where Vcc$-\Delta V$ (voltage difference caused by a noise in the first power supply Vcc) is higher than Vccq, the first comparison signal Vcc_d1 is in a high voltage level based on their driving difference so that the power comparison signal Vcc_com is not activated in a low voltage level and the PMOS transistor PM25 is turned off. In case where Vcc$+\Delta V$ (voltage difference caused by a noise in the first power supply Vcc) is lower than Vccq, the first comparison signal Vcc_d2 is in a low voltage level based on their driving difference so that the power comparison signal Vcc_com is not activated in a low voltage level and the PMOS transistor PM25 is turned off. In case where the voltage difference between Vcc$\pm\Delta V$ (voltage difference caused by a noise in the first power supply Vcc) and Vccq is within a predetermined range, the first comparison signal Vcc_d2 is in a low voltage level based on their driving difference so that the second comparison signal Vcc_d2 is activated in a high voltage level and the power comparison signal Vcc_com is activated in a low voltage level.

If both the first RAS signal ras1 and the second RAS signal ras2 are applied to the bank comparison unit 330 in a high voltage level and all the first and second banks are in an active mode, the output from the NAND gate ND33 is in a low voltage level so that the bank comparison signal bank_com is disabled. When the first or second bank is in an active mode, the first and second RAS signals ras1 and ras2 in a high voltage level are applied to the bank comparison unit 330 and the bank comparison signal bank_com is activated in a high voltage level via the NAND gate ND34. Also, in case where the first and second banks are in a standby mode, the first and second RAS signals ras1 and ras2 in a low voltage level are applied to the bank comparison unit 330 and the bank comparison signal bank_com is disabled in a low voltage level via the inverter INV33.

As stated above, the switch enable signal /sw_en is controlled in response to the power comparison signal Vcc_com, the bank comparison signal Vcc_com and the self-refresh signal self_ref and the switch enable signal /sw_en controls the PMOS transistor PM25 which selectively couples the first power supply line Vcc to the second power supply line Vccq.

On the other hand, the power supply controller 270, which is employed in selectively coupling the first power supply line Vcc to the second power supply line Vccq, can be employed in selectively coupling a first ground voltage level in the internal circuit 210 to a second ground voltage level in the data input/out unit 230.

As apparent from the above, the present invention has an effect on the reduction of a noise generated on the power line, by selectively using the chip driving power and the data input/output driving power. Furthermore, the present invention increases the operation speed of the memory device by effectively using the power lines.

While the present invention has been described with respect to the particular embodiments, it will be apparent to those skilled in the art that various changes and modifications may be made without departing from the scope of the invention as defined in the following claims.

What is claimed is:

1. A semiconductor memory device comprising:
   a switching means for selectively coupling a first power line providing power to an internal circuit to a second power line providing power to a data input/output unit in response to a control signal which is produced according to an operation mode; and
   a control means for receiving row address strobe signals corresponding to each of memory banks, and a self-refresh signal activated in a refresh mode, and producing the control signal.

2. The memory device in accordance with claim 1, wherein the switching means couples the first power line to the second power line when one of the memory banks is activated and when the memory device is in the refresh mode, in case where a voltage difference is within a predetermined range.

3. The memory device in accordance with claim 2, wherein the switching means is a PMOS transistor coupling the first power line to the second power in response to the control signal applied to a gate thereof.

4. The memory device in accordance with claim 1, wherein the control means comprises:

a bank comparison means for producing a bank comparison signal by comparing a first row address strobe signal corresponding to a first memory bank with a second row address strobe signal corresponding to a second memory bank;

a power comparison means for producing a power comparison signal when a voltage difference between the first power line and the second power line is within a predetermined voltage range; and a switch enable signal generating means for receiving the bank comparison signal, the self-refresh signal and the power comparison signal and producing the control signal.

5. The memory device in accordance with claim 4, wherein the bank comparison means comprises:

a first logic circuit for ORing the first and second row address strobe signals;

a second logic circuit for NANDing the first and second row address strobe signals; and a third logic circuit for NANDing output signals from the first and second logic circuits.

6. The memory device in accordance with claim 5, wherein the bank comparison signal is enabled when the first and second banks are in the operation mode.

7. The memory device in accordance with claim 4, wherein the power comparison means comprises:

a differential amplifier for sensing and amplifying the voltage difference between the first power line and the second power line and outputting first and second voltage signals; and a logic circuit for ANDing an inverted signal from the first voltage signal and the second voltage signal.

8. The memory device in accordance with claim 7, wherein the differential amplifier comprises:

a first NMOS transistor having a gate, which receives an amplifier enable signal, in order to provide power to the differential amplifier;

a second NMOS transistor having a gate, which is connected to the first power supply line, in order to pull down an output node of the differential amplifier;

a third NMOS transistor having a gate, which is connected to the second power supply line, in order to pull down the first voltage signal, wherein the third NMOS transistor has a higher drivability than the second NMOS transistor;

a fourth NMOS transistor having a gate, which is connected to the second power supply line, in order to pull down the second voltage signal, wherein the fourth NMOS transistor has a lower drivability than the second NMOS transistor;

a first PMOS transistor having a gate, which is connected to the output node of the differential amplifier, in order to pull up the output node of the differential amplifier;

a second PMOS transistor having a gate, which is connected to the output node of the differential amplifier, in order to pull up the first voltage signal; and a third PMOS transistor having a gate, which is connected to the output node of the differential amplifier, in order to pull up the second voltage signal.

9. The memory device in accordance with claim 8, wherein the drivability of the third PMOS transistor is determined in order that the third PMOS transistor is enabled when the voltage difference between the first and second power lines is within the predetermined voltage range, wherein the drivability of the fourth PMOS transistor is determined in order that the fourth PMOS transistor is disabled when the voltage difference between the first and second power lines is within the predetermined voltage range, and wherein the power comparison signal is activated.

10. The memory device in accordance with claim 4, wherein the switch enable signal generating means comprises:

a first logic circuit for ORing the self-refresh signal and the bank comparison signal; and a second logic circuit for NANDing an output signal from the first logic circuit and the power comparison signal.

11. The memory device in accordance with claim 10, wherein the switch enable signal is activated when the power comparison signal is activated or when either the bank comparison signal or the self-refresh signal is activated.

* * * * *